United States Patent
Ding

(10) Patent No.: US 11,355,527 B2
(45) Date of Patent: Jun. 7, 2022

(54) DISPLAY PANEL AND PREPARATION METHOD THEREOF, AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Ding Ding, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 82 days.

(21) Appl. No.: 16/608,881

(22) PCT Filed: Sep. 11, 2019

(86) PCT No.: PCT/CN2019/105264
§ 371 (c)(1),
(2) Date: Oct. 28, 2019

(87) PCT Pub. No.: WO2020/228199
PCT Pub. Date: Nov. 19, 2020

(65) Prior Publication Data
US 2020/0365625 A1    Nov. 19, 2020

(30) Foreign Application Priority Data
May 16, 2019 (CN) .......................... 201910406564.8

(51) Int. Cl.
*H01L 27/12* (2006.01)
*H01L 27/32* (2006.01)

(52) U.S. Cl.
CPC ...... *H01L 27/1248* (2013.01); *H01L 27/1244* (2013.01); *H01L 27/1259* (2013.01);
(Continued)

(58) Field of Classification Search
None
See application file for complete search history.

(56) References Cited

U.S. PATENT DOCUMENTS

2018/0366496 A1* 12/2018 Li ..................... H01L 27/3262
2019/0131367 A1    5/2019 Kim et al.
(Continued)

FOREIGN PATENT DOCUMENTS

CN    108573920 A    9/2018
CN    109300848 A    2/2019
(Continued)

*Primary Examiner* — Grant S Withers
(74) *Attorney, Agent, or Firm* — Mark M. Friedman

(57) ABSTRACT

A display panel and a preparation method thereof, and a display device are disclosed. The display panel includes a display region and a bending region located outside the display region. The display panel includes a source-and-drain electrode metal layer. The display panel includes an organic photoresist layer in the bending region. A bending-region interlayer dielectric layer is disposed at one side of the organic photoresist layer near the source-and-drain electrode metal layer. Source-and-drain electrode traces can be prevented from breaking.

11 Claims, 5 Drawing Sheets

(52) U.S. Cl.
CPC ...... *H01L 27/1262* (2013.01); *H01L 27/1218* (2013.01); *H01L 27/3258* (2013.01)

(56) References Cited

U.S. PATENT DOCUMENTS

| | | |
|---|---|---|
| 2019/0259967 A1 | 8/2019 | Yang |
| 2020/0106045 A1* | 4/2020 | Han .................... H01L 27/3246 |
| 2020/0185423 A1 | 6/2020 | Hu |

FOREIGN PATENT DOCUMENTS

| | | |
|---|---|---|
| CN | 109671719 A | 4/2019 |
| CN | 109686758 A | 4/2019 |

* cited by examiner

DISPLAY PANEL AND PREPARATION METHOD THEREOF, AND DISPLAY DEVICE

BACKGROUND OF DISCLOSURE

1. Field of Disclosure

The present disclosure relates to the field of display technology, and more particularly, to a display panel and a preparation method thereof, and a display device.

2. Description of Related Art

Currently, organic light-emitting diode (OLED) display devices have gradually become the mainstream display field due to their excellent performance in terms of low power consumption, high color saturation, and wide view angle. In order to increase a screen ratio of a display region, a bending region is formed and surrounds a lower display region, and the bending region is bent to the back of a panel at a module manufacturing stage.

Source-and-drain (SD) electrode traces are deposited above an organic photoresist layer. In a dry etching process for source-and-drain electrode traces, the organic photoresist layer below the source-and-drain electrode traces is etched due to aluminum erosion, incurring loss to the organic photoresist layer.

That is, in conventional technologies, the organic photoresist layer is prone to suffer losses in the dry etching process for source-and-drain electrode traces, causing the source-and-drain electrode traces to break.

SUMMARY

A technical problem is that, in conventional technologies, an organic photoresist layer is prone to suffer losses in a dry etching process for source-and-drain electrode traces, causing source-and-drain electrode traces to break.

An embodiment of the present disclosure provides a display panel and a preparation method thereof, and a display device, capable of reducing a loss of the organic photoresist layer in the dry etching process for source-and-drain electrode traces and thus preventing the source-and-drain electrode traces from breaking.

In order to solve the above problems, firstly, the present disclosure provides a display panel, including a display region; a bending region located outside the display region; a source-and-drain electrode metal layer; and an organic photoresist layer in the bending region, wherein a bending-region interlayer dielectric layer is disposed at one side of the organic photoresist layer near the source-and-drain electrode metal layer.

The source-and-drain electrode metal layer includes source-and-drain electrode metal lines parallel to a surface direction of the display panel and spaced apart from each other. In the bending region, the bending-region interlayer dielectric layer is disposed in projection regions of the source-and-drain electrode metal lines, and a thickness of the bending-region interlayer dielectric layer is a first predetermined value.

In the display region, a first display-region interlayer dielectric layer, a second display-region interlayer dielectric layer, a gate electrode metal layer, and a display-region gate insulating layer are disposed sequentially at one side of the source-and-drain electrode metal layer near the organic photoresist layer. A side face of the first display-region interlayer dielectric layer away from the source-and-drain electrode metal layer is aligned with a side face of the bending-region interlayer dielectric layer away from the source-and-drain electrode metal layer.

A thickness of the first display-region interlayer dielectric layer in the projection regions of the source-and-drain electrode metal lines is the first predetermined value. A thickness of the first display-region interlayer dielectric layer between the projection regions of the source-and-drain electrode metal lines is a second predetermined value. The first predetermined value is greater than the second predetermined value.

The first display-region interlayer dielectric layer and the bending-region interlayer dielectric layer are formed at a first predetermined temperature, the second display-region interlayer dielectric layer is formed at a second predetermined temperature, and the first predetermined temperature is lower than the second predetermined temperature.

The first predetermined value is greater than 0 and is less than or equal to 200 nanometers.

The organic photoresist layer is filled with an organic photoresist material, and the bending-region interlayer dielectric layer includes at least one material selected from a group consisting of silicon nitride, silicon oxide, and a compound of silicon nitride and silicon oxide.

In order to solve the above problems, secondly, the present disclosure provides a display device, including a display panel, the display panel including a display region, a bending region located outside the display region, and a source-and-drain electrode metal layer.

The display panel includes an organic photoresist layer in the bending region. A bending-region interlayer dielectric layer is disposed at one side of the organic photoresist layer near the source-and-drain electrode metal layer.

The source-and-drain electrode metal layer includes source-and-drain electrode metal lines parallel to a surface direction of the display panel and spaced apart from each other.

In the bending region, the bending-region interlayer dielectric layer is disposed in projection regions of the source-and-drain electrode metal lines, and a thickness of the bending-region interlayer dielectric layer is a first predetermined value.

In the display region, a first display-region interlayer dielectric layer, a second display-region interlayer dielectric layer, a gate electrode metal layer, and a display-region gate insulating layer are disposed sequentially at one side of the source-and-drain electrode metal layer near the organic photoresist layer.

A side face of the first display-region interlayer dielectric layer away from the source-and-drain electrode metal layer is aligned with a side face of the bending-region interlayer dielectric layer away from the source-and-drain electrode metal layer.

A thickness of the first display-region interlayer dielectric layer in the projection regions of the source-and-drain electrode metal lines is the first predetermined value.

A thickness of the first display-region interlayer dielectric layer between the projection regions of the source-and-drain electrode metal lines is a second predetermined value, and the first predetermined value is greater than the second predetermined value.

The first display-region interlayer dielectric layer and the bending-region interlayer dielectric layer are formed at a first predetermined temperature, the second display-region interlayer dielectric layer is formed at a second predetermined temperature, and the first predetermined temperature is lower than the second predetermined temperature.

The first display-region interlayer dielectric layer and the bending-region interlayer dielectric layer are formed at a first predetermined temperature, the second display-region interlayer dielectric layer is formed at a second predetermined temperature, and the first predetermined temperature is lower than the second predetermined temperature.

The first predetermined value is greater than 0 and is less than or equal to 200 nanometers.

The organic photoresist layer is filled with an organic photoresist material, and the bending-region interlayer dielectric layer includes at least one material selected from a group consisting of silicon nitride, silicon oxide, and a compound of silicon nitride and silicon oxide.

In order to solve the above problems, thirdly, the present disclosure provides a method for preparing a display panel including a display region and a bending region located outside the display region, the method including:

preparing an organic photoresist layer in the bending region of the display panel;

preparing a bending-region interlayer dielectric layer on the organic photoresist layer; and preparing a source-and-drain electrode metal layer on the bending-region interlayer dielectric layer, wherein the bending-region interlayer dielectric layer is configured to reduce a loss of the organic photoresist layer during the preparing of the source-and-drain electrode metal layer.

The step of preparing the bending-region interlayer dielectric layer on the organic photoresist layer includes:

preparing the bending-region interlayer dielectric layer whose a thickness is a first predetermined value on the organic photoresist layer.

The step of preparing the source-and-drain electrode metal layer on the bending-region interlayer dielectric layer includes:

preparing source-and-drain electrode metal lines parallel to a surface direction of the display panel and spaced apart from each other through a dry etching process, and etching the bending-region interlayer dielectric layer located between projection regions of the source-and-drain electrode metal lines until the thickness of the bending-region interlayer dielectric layer is a second predetermined value.

The step of preparing the organic photoresist layer in the bending region of the display panel includes:

sequentially preparing a display-region gate insulating layer, a gate electrode metal layer, and a second display-region interlayer dielectric layer in the display region of the display panel, and preparing the organic photoresist layer in the bending region of the display panel.

The step of preparing the bending-region interlayer dielectric layer on the organic photoresist layer includes:

preparing a first interlayer dielectric layer on surfaces of the second display-region interlayer dielectric layer and the organic photoresist layer, wherein the first interlayer dielectric layer includes a first display-region interlayer dielectric layer located in the display region and a bending-region interlayer dielectric layer located in the bending region, and a side face of the first display-region interlayer dielectric layer near the second display-region interlayer dielectric layer is aligned with a side face of the bending-region interlayer dielectric layer near the organic photoresist layer.

A first predetermined temperature is lower than a second predetermined temperature.

The step of sequentially preparing the display-region gate insulating layer, the gate electrode metal layer, and the second display-region interlayer dielectric layer in the display region of the display panel includes:

preparing the second display-region interlayer dielectric layer at the second predetermined temperature.

The step of preparing the first interlayer dielectric layer on the surfaces of the second display-region interlayer dielectric layer and the organic photoresist layer includes:

preparing the first interlayer dielectric layer at the first predetermined temperature.

The beneficial effect of the present disclosure is that, compared with conventional technologies, the present disclosure provides a display panel, including: a display region; a bending region located outside the display region; a source-and-drain electrode metal layer; and an organic photoresist layer in the bending region, wherein a bending-region interlayer dielectric layer is disposed at one side of the organic photoresist layer near the source-and-drain electrode metal layer. In the present disclosure, the bending-region interlayer dielectric layer is disposed between the source-and-drain electrode metal layer and the organic photoresist layer, which can reduce a loss of the organic photoresist layer in the dry etching process for source-and-drain electrode traces and thus prevent the source-and-drain electrode traces from breaking.

BRIEF DESCRIPTION OF DRAWINGS

In order to more clearly explain the technical solutions in the embodiments of the present disclosure, the accompanying drawings used in the description of the embodiments are introduced simply below. It is obvious that the accompanying drawings in the following description are merely a part of the embodiments of the present disclosure. A person having ordinary skill in this field can also obtain other accompanying drawings according to the accompanying drawings under the premise of not paying creative works.

In order to more clearly explain the technical solutions in the embodiments of the present disclosure, the accompanying drawings used in the description of the embodiments are introduced simply below. It is obvious that the accompanying drawings in the following description are merely a part of the embodiments of the present disclosure. A person having ordinary skill in this field can also obtain other accompanying drawings according to the accompanying drawings under the premise of not paying creative works.

DETAILED DESCRIPTION OF EMBODIMENTS

Figure 1:
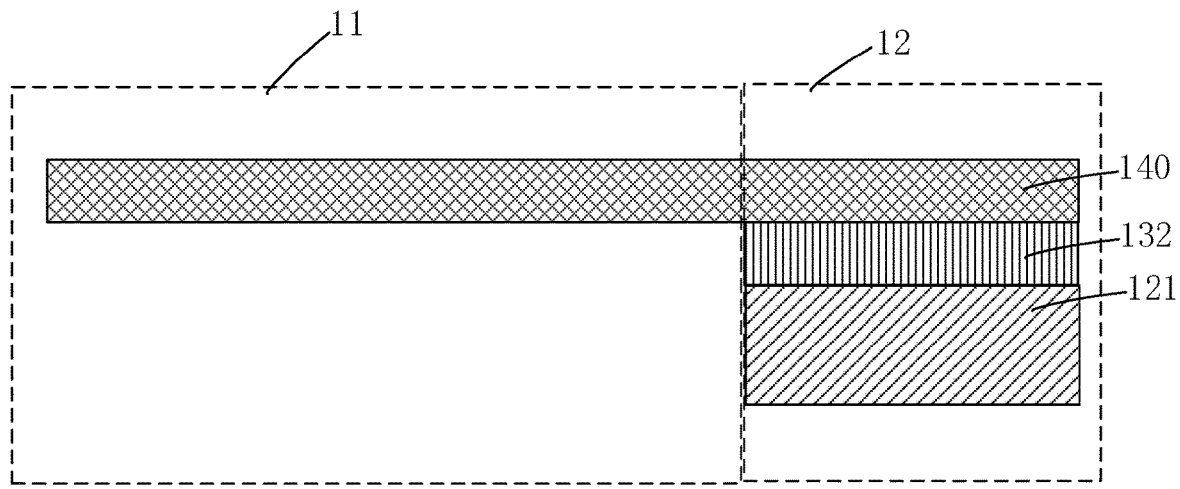
FIG. 1 is a schematic structural diagram of a display panel according to one embodiment of the present disclosure.

For the embodiments of the present disclosure, their technical solutions will be described clearly and completely in conjunction with their accompanying drawings below. It is obvious that the embodiments described herein are merely a part of the embodiments of the present disclosure instead of all of the embodiments. A person having ordinary skill in this field can obtain other embodiments according to the embodiments of the present disclosure under the premise of not paying creative works, and all of these embodiments should be within the protective scope of the present disclosure.

In the description of the present disclosure, it should be understood that the orientation or positional relationships indicated by the terms such as "center", "longitudinal", "lateral", "length", "width", "thickness", "upper", "lower", "front", "rear", "left", "right", "vertical", "horizontal", "top", "bottom", "inside", "outside" and the like are orientation or positional relationships as shown in the figures, which are only for the convenience of describing the present application and simplifying the description, rather than indicating or implying that the device or element must have particular orientations or be constructed and operated in particular orientations, hence, they could not be understood as limitations to the present application. In addition, terms such as "first" and "second" are used herein for purposes of description and are not intended to indicate or imply relative importance or a quantity of technical features. Thus, features limited by "first" and "second" can be intended to indicate or imply one or more features. In the description of the present disclosure, "a plurality of" relates to two or more than two, unless otherwise specified.

In the present disclosure, the word "exemplary" is used herein to mean "serving as an example, instance, or illustration". Any embodiment described herein as "exemplary" is not necessarily to be construed as preferred or advantageous over other embodiments. The following description is presented to enable any person skilled in the art to make and use the present disclosure. Details are set forth in the following description for purpose of explanation. It should be appreciated that one of ordinary skill in the art would realize that the present disclosure may be practiced without the use of these specific details. In other instances, well known structures and processes are not elaborated in order not to obscure the description of the present disclosure with unnecessary details. Thus, the present disclosure is not intended to be limited by the embodiments shown, but is to be in accord with the widest scope consistent with the principles and features disclosed herein.

An embodiment of the present disclosure provides a display panel, including a display region; a bending region located outside the display region; a source-and-drain electrode metal layer; and an organic photoresist layer in the bending region, wherein a bending-region interlayer dielectric layer is disposed at one side of the organic photoresist layer near the source-and-drain electrode metal layer. The display panel in an embodiment of the present disclosure can be applied in various display devices and is explained in detail as follows.

Please refer to FIG. 1, which is a schematic structural diagram of a display panel according to one embodiment of the present disclosure.

In the present embodiment, a display panel 10 includes a display region 11 and a bending region 12 located outside the display region 11. The display panel 10 includes a source-and-drain electrode metal layer 140. The display panel 10 includes an organic photoresist layer 121 in the bending region 12. A bending-region interlayer dielectric layer 132 is disposed at one side of the organic photoresist layer 121 near the source-and-drain electrode metal layer 140.

In the present embodiment, the organic photoresist layer 121 is filled with an organic photoresist material. The bending-region interlayer dielectric layer 132 includes at least one material selected from a group consisting of silicon nitride, silicon oxide, and a compound of silicon nitride and silicon oxide. In other embodiments, materials of the organic photoresist layer 121 and the bending-region interlayer dielectric layer 132 can be selected according to specific situations without limiting the present disclosure. The organic photoresist layer 121 is disposed in the bending region 12 of the display panel 10, which can improve the bendability of the display panel 10. The bending-region interlayer dielectric layer 132 is disposed between the source-and-drain electrode metal layer 140 and the organic photoresist layer 121, which can reduce a loss of the organic photoresist layer 121 in the dry etching process for source-and-drain electrode traces and thus prevent the source-and-drain electrode traces from breaking.

Compared with conventional technologies, the present disclosure provides a display panel, including: a display region; a bending region located outside the display region; a source-and-drain electrode metal layer; and an organic photoresist layer in the bending region, wherein a bending-region interlayer dielectric layer is disposed at one side of the organic photoresist layer near the source-and-drain electrode metal layer. In the present disclosure, the bending-region interlayer dielectric layer is disposed between the source-and-drain electrode metal layer and the organic photoresist layer, which can reduce a loss of the organic photoresist layer in the dry etching process for source-and-drain electrode traces and thus prevent the source-and-drain electrode traces from breaking.

Figure 2:
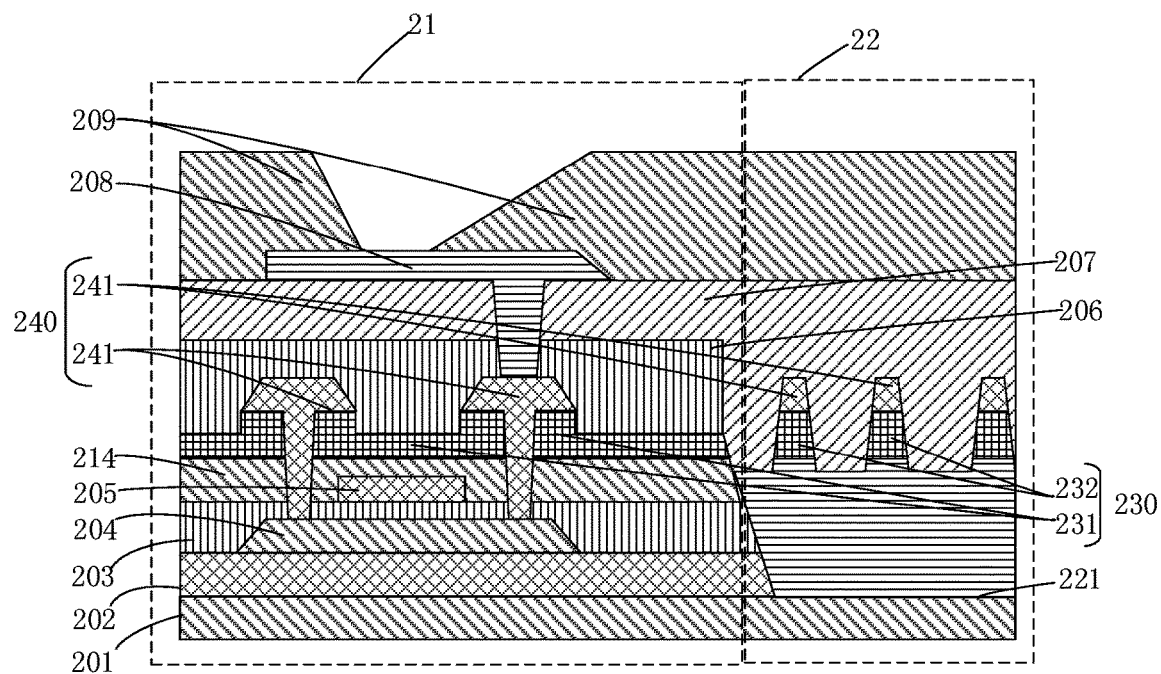
FIG. 2 is a schematic structural diagram of a display panel according to another embodiment of the present disclosure.

In order to describe the structure of the display panel of the present disclosure specifically, please refer to FIG. 2, which is a schematic structural diagram of a display panel according to another embodiment of the present disclosure.

In the present embodiment, a display panel 20 includes a display region 21 and a bending region 22 located outside the display region 21. The display panel 20 includes a source-and-drain electrode metal layer 240. The display panel 20 includes an organic photoresist layer 221 in the bending region 22. A bending-region interlayer dielectric layer 232 is disposed at one side of the organic photoresist layer 221 near the source-and-drain electrode metal layer 240.

In the present embodiment, the source-and-drain electrode metal layer 240 includes source-and-drain electrode metal lines 241 parallel to a surface direction of the display panel 20 and spaced apart from each other. In the bending region 22, the bending-region interlayer dielectric layer 232 is disposed in projection regions of the source-and-drain electrode metal lines 241, and a thickness of the bending-region interlayer dielectric layer 232 is a first predetermined value. According to specific situations, the first predetermined value can be set as any value greater than 0. For instance, the first predetermined value is greater than 0 and is less than or equal to 200 nanometers. Preferably, the first predetermined value is greater than a thickness of losses of the bending-region interlayer dielectric layer 232 while the source-and-drain electrode metal lines 241 are prepared. Because the first predetermined value is greater than the thickness of losses of the bending-region interlayer dielectric layer 232 while the source-and-drain electrode metal lines 241 are prepared, the bending-region interlayer dielectric layer 232 still has a certain thickness after the preparing of the source-and-drain electrode metal lines 241, which can reduce a loss of the organic photoresist layer 221 during the preparing of the source-and-drain electrode metal lines 241. In addition, the bendability of the source-and-drain electrode metal lines 241 can be improved through controlling the first predetermined value to control a thickness of losses of the organic photoresist layer 221.

In the present embodiment and in the display region 21, a first display-region interlayer dielectric layer 231, a second display-region interlayer dielectric layer 214, a gate electrode metal layer 205, and a display-region gate insulating layer 203 are disposed sequentially at one side of the source-and-drain electrode metal layer 240 near the organic photoresist layer 221. A side face of the first display-region interlayer dielectric layer 231 away from the source-and-drain electrode metal layer 240 is aligned with a side face of the bending-region interlayer dielectric layer 232 away from the source-and-drain electrode metal layer 240. Specifically, a first interlayer dielectric layer 230 is prepared through a process. The first interlayer dielectric layer 230 includes the first display-region interlayer dielectric layer 231 and the bending-region interlayer dielectric layer 232. The first display-region interlayer dielectric layer 231 and the bending-region interlayer dielectric layer 232 are prepared through one process, reducing process complexity and increasing preparing efficiency.

Further, an active layer 204, a buffer layer 202, and a substrate 201 are disposed sequentially at one side of the display-region gate insulating layer 203 away from the gate electrode metal layer 205.

Further, a thickness of the first display-region interlayer dielectric layer 231 in the projection regions of the source-and-drain electrode metal lines 241 is the first predetermined value. A thickness of the first display-region interlayer dielectric layer 231 between the projection regions of the source-and-drain electrode metal lines 241 is a second predetermined value. The first predetermined value is greater than the second predetermined value.

In the present embodiment, the first display-region interlayer dielectric layer 231 and the bending-region interlayer dielectric layer 232 are formed at a first predetermined temperature, the second display-region interlayer dielectric layer 214 is formed at a second predetermined temperature, and the first predetermined temperature is lower than the second predetermined temperature. That is, the first display-region interlayer dielectric layer 231 and the bending-region interlayer dielectric layer 232 are formed at a low temperature, and the second display-region interlayer dielectric layer 214 is formed at a high temperature. The first display-region interlayer dielectric layer 231 and the bending-region interlayer dielectric layer 232 are formed at a low temperature, preventing damage from high temperatures to the organic photoresist layer 221.

Compared with conventional technologies, the present disclosure provides a display panel, including: a display region; a bending region located outside the display region; a source-and-drain electrode metal layer; and an organic photoresist layer in the bending region, wherein a bending-region interlayer dielectric layer is disposed at one side of the organic photoresist layer near the source-and-drain electrode metal layer. In the present disclosure, the bending-region interlayer dielectric layer is disposed between the source-and-drain electrode metal layer and the organic photoresist layer, which can reduce a loss of the organic photoresist layer in the dry etching process for source-and-drain electrode traces and thus prevent the source-and-drain electrode traces from breaking.

Figure 3:
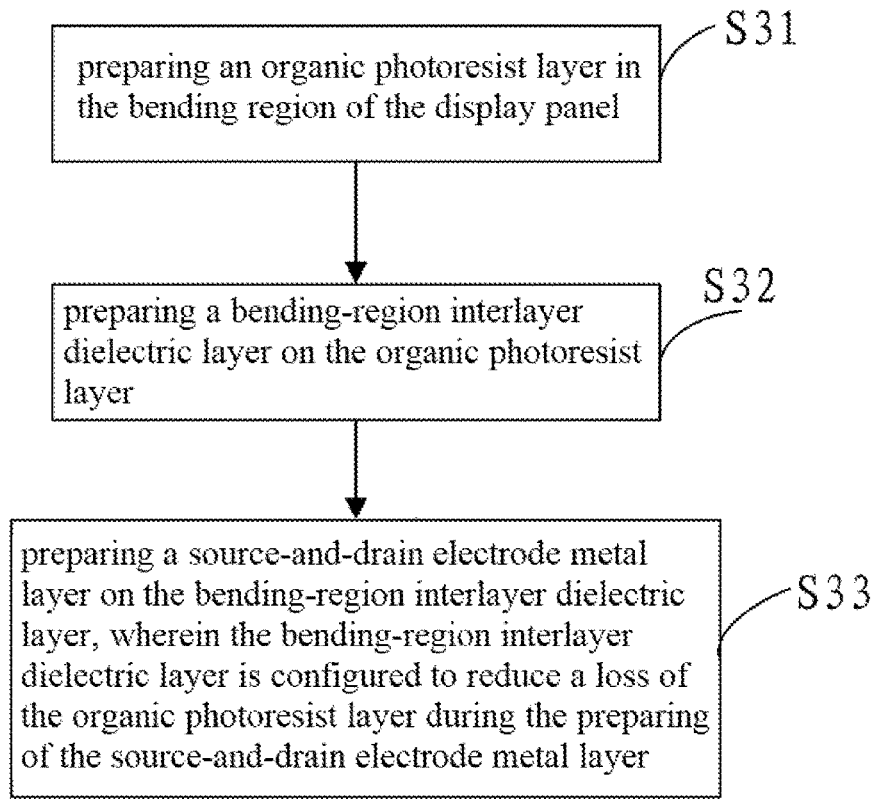
FIG. 3 is a schematic flowchart illustrating a method for preparing a display panel according to one embodiment of the present disclosure.
Figure 4:
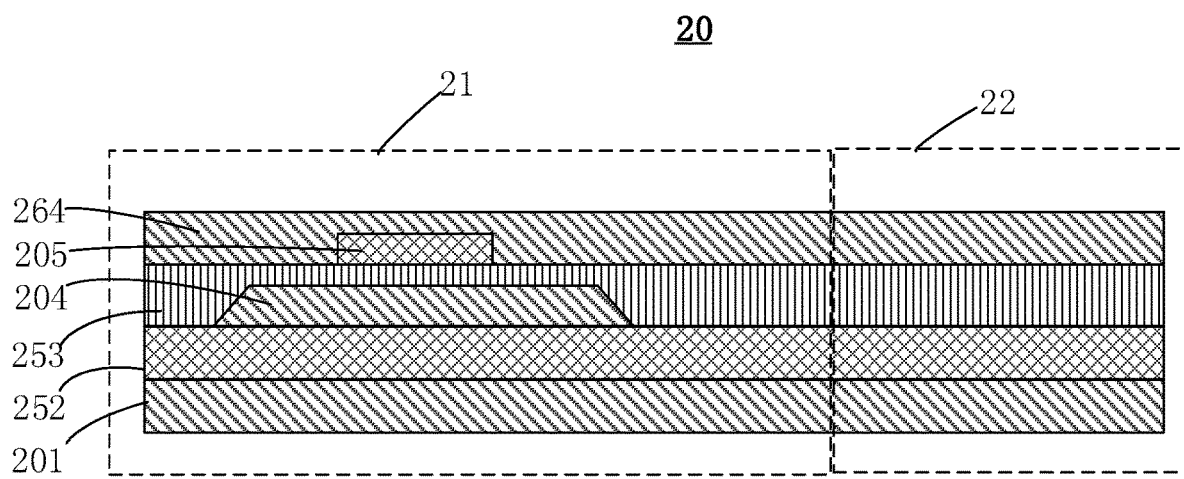
FIG. 4 is a schematic structural diagram of a display panel before step S31 as shown in FIG. 3.
Figure 5:
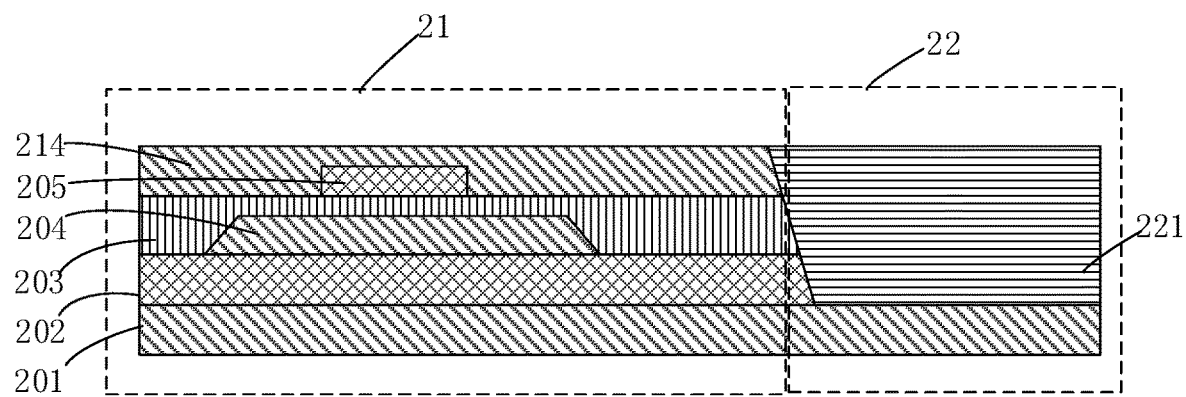
FIG. 5 is a schematic structural diagram of a display panel in step S31 as shown in FIG. 3.
Figure 6:
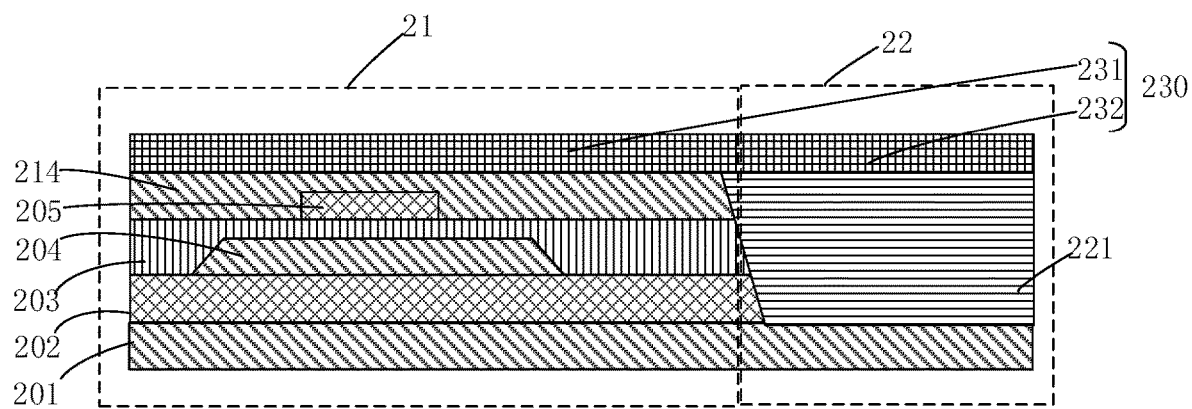
FIG. 6 is a schematic structural diagram of a display panel in step S32 as shown in FIG. 3.
Figure 7:
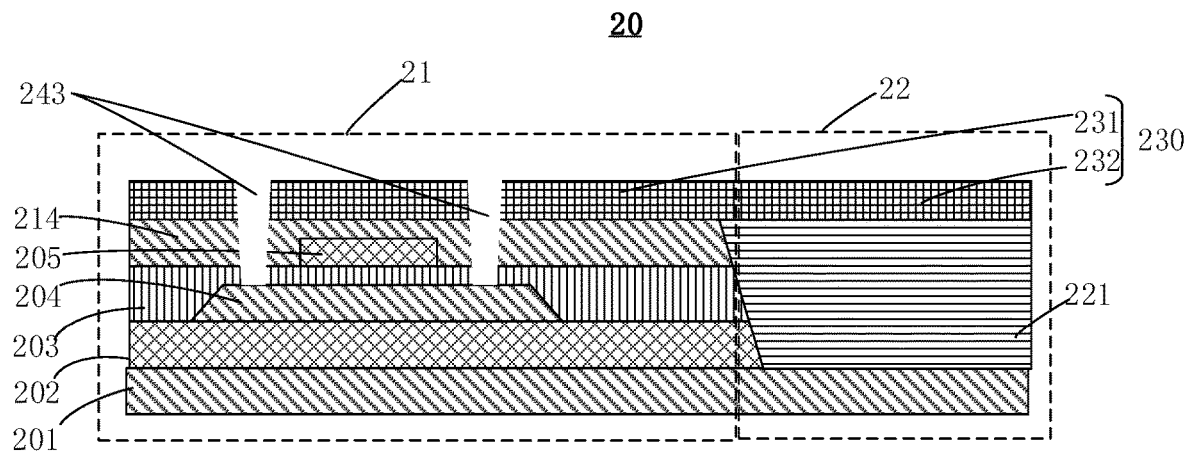
FIG. 7 is a schematic structural diagram of a display panel while contacting holes are prepared before step S33 as shown in FIG. 3.
Figure 8:
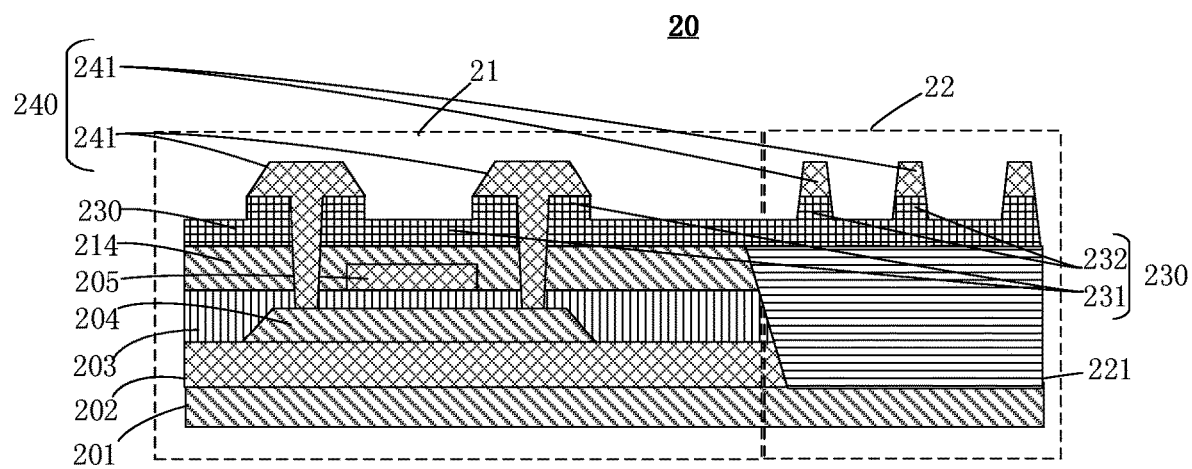
FIG. 8 is a schematic structural diagram of a display panel in step S33 as shown in FIG. 3.
Figure 9:
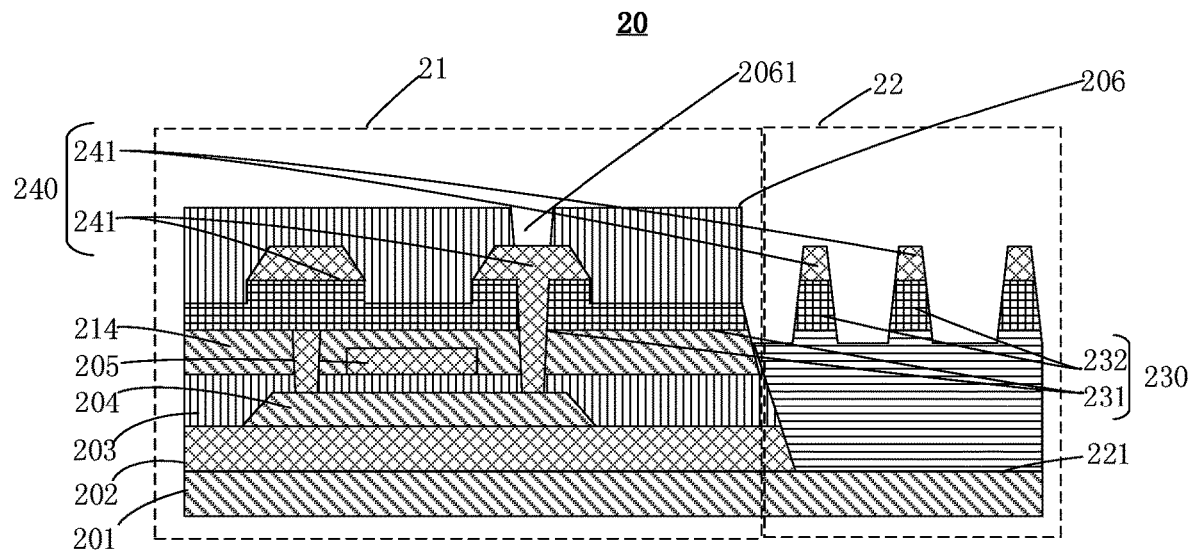
FIG. 9 is a schematic structural diagram of a display panel after step S33 as shown in FIG. 3.
Figure 10:
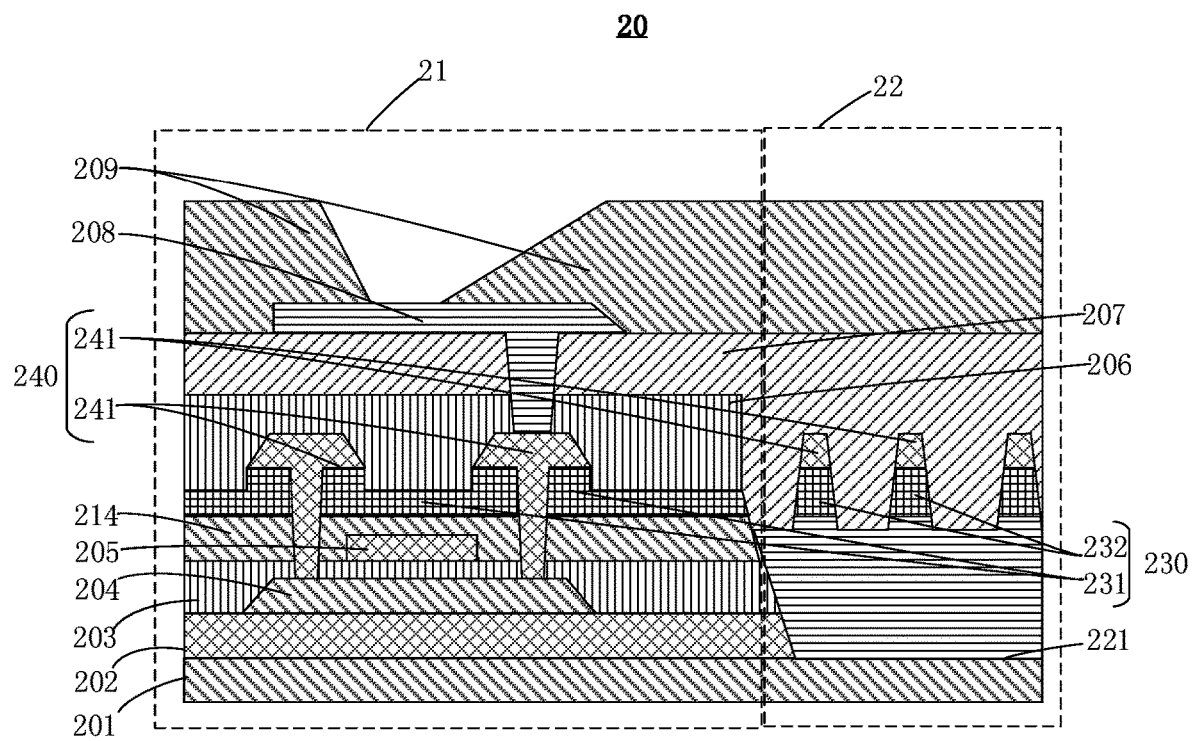
FIG. 10 is a schematic structural diagram of a display panel prepared by the preparation method as shown in FIG. 3.

Please refer to FIGS. 3-10, wherein FIG. 3 is a schematic flowchart illustrating a method for preparing a display panel according to one embodiment of the present disclosure, FIG. 4 is a schematic structural diagram of a display panel before step S31 as shown in FIG. 3, FIG. 5 is a schematic structural diagram of a display panel in step S31 as shown in FIG. 3, FIG. 6 is a schematic structural diagram of a display panel in step S32 as shown in FIG. 3. FIG. 7 is a schematic structural diagram of a display panel while contacting holes are prepared before step S33 as shown in FIG. 3, FIG. 8 is a schematic structural diagram of a display panel in step S33 as shown in FIG. 3, FIG. 9 is a schematic structural diagram of a display panel after step S33 as shown in FIG. 3, and FIG. 10 is a schematic structural diagram of a display panel prepared by the preparation method as shown in FIG. 3. The display panel is the above display panel 20. In conjunction with FIGS. 3-10, the method for preparing the display panel specifically includes the following processes:

Step S31: preparing an organic photoresist layer in the bending region of the display panel.

As shown in FIG. 4, in the present embodiment, the substrate 201 is provided firstly. A buffer layer 252 and the active layer 204 are prepared sequentially on the substrate 201. The buffer layer 252 is configured to prevent impurities in the substrate 201 from diffusing into devices of the display panel. The substrate 201 can be a glass substrate or a plastic substrate. Preferably, the substrate 201 is a flexible substrate. Without limiting the present disclosure, materials of the substrate 201 can be polyimide (PI) or polyethylene terephthalate (PET).

Further, a gate insulating layer 253 and the gate electrode metal layer 205 are disposed sequentially at one side of the active layer 204 away from the buffer layer 252. In a specific embodiment, the gate electrode metal layer 205 includes a first gate electrode metal layer and a second gate electrode metal layer. The gate insulating layer 253 includes a first gate insulating layer and a second gate insulating layer. Firstly, the first gate insulating layer is prepared on the active layer 204, and the first gate electrode metal layer is prepared on the first gate insulating layer. Then, the active layer 204 is doped with ions using the first gate insulating layer as a mask. After injecting the ions, the second gate insulating layer and the second gate electrode metal layer are prepared sequentially on the first gate electrode metal layer. A capacitor is formed between the first gate electrode metal layer and the second gate electrode metal layer.

Further, a second interlayer dielectric layer 264 is prepared on the gate electrode metal layer 205. Materials of the second interlayer dielectric layer 264 is silicon nitride, silicon oxide, or a compound of silicon nitride and silicon oxide. In other embodiments, materials of the second interlayer dielectric layer 264 can be selected according to specific situations without limiting the present disclosure.

As shown in FIG. 5, in the present embodiment, an organic photoresist groove is formed by etching the buffer layer 252, the gate insulating layer 253, and the second interlayer dielectric layer 264 located in the bending region 22 using a photomask. The organic photoresist groove is filled with an organic photoresist material, so that the organic photoresist layer 221 is formed. Parts of the buffer layer 252, the gate insulating layer 253, and the second interlayer dielectric layer 264 kept in the display region 21 are a display-region buffer layer 202, the display-region gate insulating layer 203, and the second display-region interlayer dielectric layer 214 respectively.

Without limiting the present disclosure, in other embodiments, the display-region buffer layer 202, the active layer 204, the display-region gate insulating layer 203, the gate electrode metal layer 205, and the second display-region interlayer dielectric layer 214 can also be prepared sequentially in the display region 21, and then the organic photoresist layer 221 is prepared directly in the bending region 22.

Step S32: preparing a bending-region interlayer dielectric layer on the organic photoresist layer.

As shown in FIG. 6, in the present embodiment, the first interlayer dielectric layer 230 is prepared on surfaces of the second display-region interlayer dielectric layer 214 and the organic photoresist layer 221. The first interlayer dielectric layer 230 includes the first display-region interlayer dielectric layer 231 located in the display region 21 and the bending-region interlayer dielectric layer 232 located in the bending region 22. A side face of the first display-region interlayer dielectric layer 231 near the second display-region interlayer dielectric layer 214 is aligned with a side face of the bending-region interlayer dielectric layer 232 near the organic photoresist layer 221. That is, the first display-region interlayer dielectric layer 231 and the bending-region interlayer dielectric layer 232 are prepared through one process. Without limiting the present disclosure, in other embodiments, the first display-region interlayer dielectric layer 231 and the bending-region interlayer dielectric layer 232 can also be prepared respectively.

In the present embodiment, the first interlayer dielectric layer 230 whose a thickness is the first predetermined value is prepared on the surfaces of the second display-region interlayer dielectric layer 214 and the organic photoresist layer 221. In other embodiments, the bending-region interlayer dielectric layer 232 whose a thickness is the first predetermined value can only be prepared on the surface of the organic photoresist layer 221. According to specific situations, the first predetermined value can be set as any value greater than 0. For instance, the first predetermined value is greater than 0 and is less than or equal to 200 nanometers. Preferably, the first predetermined value is greater than a thickness of losses of the bending-region interlayer dielectric layer 232 while the source-and-drain electrode metal lines 241 are prepared. In other embodiments, if the first display-region interlayer dielectric layer 231 and the bending-region interlayer dielectric layer 232 are prepared respectively, their thicknesses can be different. That is, according to specific situations, the thickness of the first display-region interlayer dielectric layer 231 may be not the first predetermined value. Because the first predetermined value is greater than the thickness of losses of the bending-region interlayer dielectric layer 232 while the source-and-drain electrode metal lines 241 are prepared, the bending-region interlayer dielectric layer 232 still has a certain thickness after the preparing of the source-and-drain electrode metal lines 241, which can reduce a loss of the organic photoresist layer 221 during the preparing of the source-and-drain electrode metal lines 241. In addition, the bendability of the source-and-drain electrode metal lines 241 can be improved through controlling the first predetermined value to control a thickness of losses of the organic photoresist layer.

Further, the second display-region interlayer dielectric layer 214 is formed at the second predetermined temperature, and the first interlayer dielectric layer 230 is formed at the first predetermined temperature. That is, the first display-region interlayer dielectric layer 231 and the bending-region interlayer dielectric layer 232 are formed at a low temperature, and the second display-region interlayer dielectric layer 214 is formed at a high temperature. The first display-region interlayer dielectric layer 231 and the bending-region interlayer dielectric layer 232 are formed at a low temperature, preventing damage from high temperatures to the organic photoresist layer 221.

Step S33: preparing a source-and-drain electrode metal layer on the bending-region interlayer dielectric layer, wherein the bending-region interlayer dielectric layer is configured to reduce a loss of the organic photoresist layer during the preparing of the source-and-drain electrode metal layer.

As shown in FIG. 7, in the present embodiment, contacting holes 243 are prepared in the display region 21 before the step of preparing the source-and-drain electrode metal layer 240. The contacting holes 243 pass through the first display-region interlayer dielectric layer 231, the second display-region interlayer dielectric layer 214, and the display-region gate insulating layer 203 so that the active layer 204 is exposed and connected to the source-and-drain electrode metal lines 241.

As shown in FIG. 8, in the present embodiment, preparing the source-and-drain electrode metal lines 241 parallel to a surface direction of the display panel 20 and spaced apart from each other through a dry etching process, and etching the first display-region interlayer dielectric layer 231 and the bending-region interlayer dielectric layer 232 located between projection regions of the source-and-drain electrode metal lines 241 until their thickness are the second predetermined value. The second predetermined value is greater than 0 and is less than the first predetermined value. Preferably, the difference between the first predetermined value and the second predetermined value is not less than a thickness of losses of the bending-region interlayer dielectric layer while the source-and-drain electrode metal lines 241 are prepared. Without limiting the present disclosure, in other embodiments, the source-and-drain electrode metal lines 241 can also be prepared through a wet etching process. Also, the bending-region interlayer dielectric layer 232 can only be etched until its thickness is the second predetermined value. As the bending-region interlayer dielectric layer 232 whose a thickness is the second predetermined value is kept, a loss of the organic photoresist layer 221 is not incurred while the source-and-drain electrode metal lines 241 are prepared.

Further, as shown in FIG. 9, a passivation layer 206 is prepared. Specifically, passivation layer holes 2061 are prepared in the passivation layer 206 located in the display region 21, and the first display-region interlayer dielectric layer 231 is kept. The passivation layer 206 located in the bending region 22 is fully etched using the source-and-drain electrode metal lines 241 as a mask. While the passivation layer 206 located in the bending region 22 is fully etched, the bending-region interlayer dielectric layer 232 located between the projection regions of the source-and-drain electrode metal lines 241 is etched. After the bending-region interlayer dielectric layer 232 located between the projection regions of the source-and-drain electrode metal lines 241 is etched, the bending-region interlayer dielectric layer 232 is not as a whole, so that the bendability of the bending region 22 of the display panel 20 can be improved.

Further, as shown in FIG. 10, after the passivation layer 206 is prepared, a planarization layer 207, an anode layer 208, a pixel definition layer 209, and a support (not shown) are prepared sequentially.

Compared with conventional technologies, the present disclosure provides a method for preparing a display panel including a display region and a bending region located outside the display region. The method for preparing the display panel includes preparing an organic photoresist layer in the bending region of the display panel; preparing a bending-region interlayer dielectric layer on the organic photoresist layer; and preparing a source-and-drain electrode metal layer on the bending-region interlayer dielectric layer, wherein the bending-region interlayer dielectric layer is configured to reduce a loss of the organic photoresist layer during the preparing of the source-and-drain electrode metal layer. In the present disclosure, the bending-region interlayer dielectric layer is disposed between the source-and-drain electrode metal layer and the organic photoresist layer, which can reduce a loss of the organic photoresist layer in the dry etching process for source-and-drain electrode traces and thus prevent the source-and-drain electrode traces from breaking.

It needs to be stated that in the above embodiment, the above structure of the display panel is only described. It can be understood that in an embodiment of the present disclosure, the display panel can further include any necessary structure as needed except the above structure, instead of limiting the present disclosure.

When being implemented specifically, the above units or structure can be realized as independent entities or be assembled as the same or some entities in any form. Specific embodiments of the above units or structure can be referenced to the above methodical embodiment, and they are not repeated here.

The display panel and the preparation method thereof provided in the embodiments of the present disclosure are introduced in detail above. Specific embodiments are used for illustrating principles and implementation manners of the present disclosure. The above descriptions of the embodiments are merely for understanding the present disclosure. At the same time, a person skilled in the art may make modifications to the specific implementation manners and application ranges according to the idea of the present disclosure. In conclusion, the content of the specification shall not be regarded as a limitation to the present disclosure.

What is claimed is:

1. A display panel, comprising:
    a display region;
    a bending region located outside the display region;
    a source-and-drain electrode metal layer; and
    an organic photoresist layer in the bending region, wherein a bending-region interlayer dielectric layer is disposed at one side of the organic photoresist layer near the source-and-drain electrode metal layer;
    wherein the source-and-drain electrode metal layer comprises source-and-drain electrode metal lines parallel to a top surface of the display panel and spaced apart from each other; and
    wherein in the bending region, the bending-region interlayer dielectric layer comprises multiple parts spaced apart from each other and respectively disposed in orthographic projection regions of the source-and-drain electrode metal lines, and a minimum thickness of the bending-region interlayer dielectric layer has a first predetermined value;
    wherein in the display region, a first display-region interlayer dielectric layer, a second display-region interlayer dielectric layer, a gate electrode metal layer, and a display-region gate insulating layer are disposed sequentially at one side of the source-and-drain electrode metal layer near the organic photoresist layer;
    wherein a surface of the first display-region interlayer dielectric layer away from the source-and-drain electrode metal layer is flush with a surface of the bending-region interlayer dielectric layer away from the source-and-drain electrode metal layer;
    wherein a minimum thickness of the first display-region interlayer dielectric layer in the orthographic projection regions of the source-and-drain electrode metal lines has the first predetermined value; and
    wherein a minimum thickness of the first display-region interlayer dielectric layer between the orthographic projection regions of the source-and-drain electrode metal lines has a second predetermined value, and the first predetermined value is greater than the second predetermined value.

2. The display panel of claim 1, wherein the first display-region interlayer dielectric layer and the bending-region interlayer dielectric layer are formed at a first predetermined temperature, the second display-region interlayer dielectric layer is formed at a second predetermined temperature, and the first predetermined temperature is lower than the second predetermined temperature.

3. The display panel of claim 1, wherein the first predetermined value is greater than 0 and is less than or equal to 200 nanometers.

4. The display panel according to claim 1, wherein the organic photoresist layer is filled with an organic photoresist material, and the bending-region interlayer dielectric layer comprises at least one material selected from a group consisting of silicon nitride, silicon oxide, and a compound of silicon nitride and silicon oxide.

5. A display device, comprising a display panel, the display panel comprising a display region, a bending region located outside the display region, a source-and-drain electrode metal layer, and an organic photoresist layer in the bending region, wherein a bending-region interlayer dielectric layer is disposed at one side of the organic photoresist layer near the source-and-drain electrode metal layer;
    wherein the source-and-drain electrode metal layer comprises source-and-drain electrode metal lines parallel to a top surface of the display panel and spaced apart from each other;
    wherein in the bending region, the bending-region interlayer dielectric layer comprises multiple parts spaced apart from each other and respectively disposed in orthographic projection regions of the source-and-drain electrode metal lines, and a minimum thickness of the bending-region interlayer dielectric layer has a first predetermined value;
    wherein in the display region, a first display-region interlayer dielectric layer, a second display-region interlayer dielectric layer, a gate electrode metal layer, and a display-region gate insulating layer are disposed sequentially at one side of the source-and-drain electrode metal layer near the organic photoresist layer;
    wherein a surface of the first display-region interlayer dielectric layer away from the source-and-drain electrode metal layer is flush with a surface of the bending-region interlayer dielectric layer away from the source-and-drain electrode metal layer;
    wherein a minimum thickness of the first display-region interlayer dielectric layer in the orthographic projection regions of the source-and-drain electrode metal lines is the first predetermined value; and wherein a minimum thickness of the first display-region interlayer dielectric layer between the orthographic projection regions of the source-and-drain electrode metal lines has a second predetermined value, and the first predetermined value is greater than the second predetermined value.

6. The display device of claim 5, wherein the first display-region interlayer dielectric layer and the bending-region interlayer dielectric layer are formed at a first predetermined temperature, the second display-region interlayer dielectric layer is formed at a second predetermined temperature, and the first predetermined temperature is lower than the second predetermined temperature.

7. The display device of claim 5, wherein the first predetermined value is greater than 0 and is less than or equal to 200 nanometers.

8. The display device of claim 5, wherein the organic photoresist layer is filled with an organic photoresist material, and the bending-region interlayer dielectric layer comprises at least one material selected from a group consisting of silicon nitride, silicon oxide, and a compound of silicon nitride and silicon oxide.

9. A method for preparing a display panel comprising a display region and a bending region located outside the display region, the method comprising:
    preparing an organic photoresist layer in the bending region of the display panel;
    preparing a bending-region interlayer dielectric layer on the organic photoresist layer, wherein the step of preparing the bending-region interlayer dielectric layer on the organic photoresist layer comprises preparing the bending-region interlayer dielectric layer with a minimum thickness which is a first predetermined value on the organic photoresist layer; and
    preparing a source-and-drain electrode metal layer on the bending-region interlayer dielectric layer, wherein the bending-region interlayer dielectric layer is configured to reduce a loss of the organic photoresist layer during the preparing of the source-and-drain electrode metal layer, and the step of preparing the source-and-drain electrode metal layer on the bending-region interlayer dielectric layer comprises preparing source-and-drain electrode metal lines parallel to a top surface of the display panel and spaced apart from each other through a dry etching process, and etching the bending-region interlayer dielectric layer located between orthographic projection regions of the source-and-drain electrode metal lines until the minimum thickness of the bending-region interlayer dielectric layer is a second predetermined value.

10. The method of claim 9, wherein in the display region, a first display-region interlayer dielectric layer, a second display-region interlayer dielectric layer, a gate electrode metal layer, and a display-region gate insulating layer are disposed sequentially at one side of the source-and-drain electrode metal layer near the organic photoresist layer;
    wherein the step of preparing the organic photoresist layer in the bending region of the display panel comprises sequentially preparing the display-region gate insulating layer, the gate electrode metal layer, and the second display-region interlayer dielectric layer in the display region of the display panel; and
    wherein the step of preparing the bending-region interlayer dielectric layer on the organic photoresist layer comprises preparing a first interlayer dielectric layer on surfaces of the second display-region interlayer dielectric layer and the organic photoresist layer, wherein the first interlayer dielectric layer comprises the first display-region interlayer dielectric layer located in the display region and the bending-region interlayer dielectric layer located in the bending region, and a surface of the first display-region interlayer dielectric layer near the second display-region interlayer dielectric layer is flush with a surface of the bending-region interlayer dielectric layer near the organic photoresist layer.

11. The method of claim 10, wherein a first predetermined temperature is lower than a second predetermined temperature;
    wherein the step of sequentially preparing the display-region gate insulating layer, the gate electrode metal layer, and the second display-region interlayer dielectric layer in the display region of the display panel comprises preparing the second display-region interlayer dielectric layer at the second predetermined temperature; and
    wherein the step of preparing the first interlayer dielectric layer on the surfaces of the second display-region interlayer dielectric layer and the organic photoresist layer comprises preparing the first interlayer dielectric layer at the first predetermined temperature.

* * * * *